US008358790B2

(12) United States Patent
Teramoto et al.

(10) Patent No.: US 8,358,790 B2
(45) Date of Patent: Jan. 22, 2013

(54) BAND-SPLITTING TIME COMPENSATION SIGNAL PROCESSING DEVICE

(75) Inventors: Kohei Teramoto, Tokyo (JP); Masaru Kimura, Tokyo (JP); Tsuyoshi Nakada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 315 days.

(21) Appl. No.: 12/744,238

(22) PCT Filed: Nov. 18, 2008

(86) PCT No.: PCT/JP2008/003360
§ 371 (c)(1),
(2), (4) Date: May 21, 2010

(87) PCT Pub. No.: WO2009/095965
PCT Pub. Date: Aug. 6, 2009

(65) Prior Publication Data
US 2010/0260356 A1 Oct. 14, 2010

(30) Foreign Application Priority Data
Jan. 31, 2008 (JP) ................................ 2008-021218

(51) Int. Cl.
*H03G 5/00* (2006.01)
(52) U.S. Cl. ............................ 381/99; 381/97; 381/120
(58) Field of Classification Search ................ 381/1–23, 381/300–311, 26–28, 86, 97–103, 120, 119; 700/94
See application file for complete search history.

(56) References Cited

U.S. PATENT DOCUMENTS 4,137,510 A * 1/1979 Iwahara ........................ 333/132
4,751,739 A 6/1988 Serikawa et al.
5,910,990 A * 6/1999 Jang .................................. 381/1
5,930,374 A 7/1999 Werrbach et al.
8,085,950 B2 * 12/2011 Suzuki ............................ 381/97
2005/0053247 A1 * 3/2005 Petronio et al. ................. 381/99
2005/0169488 A1 8/2005 Kato et al.
2009/0304213 A1 * 12/2009 Cook et al. ................... 381/300

FOREIGN PATENT DOCUMENTS

JP 61-135298 A 6/1986
JP 62-97497 A 5/1987

(Continued)

OTHER PUBLICATIONS

"What is DEQX PDC-2.6P?", 12 pages http://www.kurizz-labo.com/Komori_report.htm.

*Primary Examiner* — Vivian Chin
*Assistant Examiner* — Fatimat O Olaniran
(74) *Attorney, Agent, or Firm* — Birch, Stewart, Kolasch & Birch, LLP

(57) ABSTRACT

A band-splitting time compensation signal processing device 2 includes a band-splitting circuit 211 for extracting, after extracting a signal of a high-frequency band component or low-frequency band component from an input signal, a signal of the low-frequency band component or high-frequency band component by subtracting the signal of the high-frequency band component or low-frequency band component from the input signal; a delay circuit 212 for delaying, for adjusting arrival time, at least one of the high-frequency band component and low-frequency band component output from the band-splitting circuit 211; and a mixing circuit 213 for combining the high-frequency band component or low-frequency band component output from the delay circuit 212 with the low-frequency band component or high-frequency band component output from the band-splitting circuit 211.

7 Claims, 3 Drawing Sheets

FOREIGN PATENT DOCUMENTS

| | | | |
|---|---|---|---|
| JP | 63-42599 | A | 2/1988 |
| JP | 64-42599 | A | 2/1989 |
| JP | 7-212896 | A | 8/1995 |
| JP | 3148060 | B2 | 3/2001 |
| JP | 2001-119800 | A | 4/2001 |
| JP | 2004-201109 | A | 7/2004 |
| JP | 2005-223887 | A | 8/2005 |

* cited by examiner

BAND-SPLITTING TIME COMPENSATION SIGNAL PROCESSING DEVICE

TECHNICAL FIELD

The present invention relates to a band-splitting time compensation signal processing device suitably applied to an audio system for driving a plurality of speaker units, which have reproduction bands split, with a single amplifier via a crossover network circuit.

BACKGROUND ART

As shown in FIG. 6, for example, as for an onboard audio system, since the distances $D_{WR}$, $D_{TR}$, $D_{WL}$, and $D_{TL}$ (all of which are represented by solid lines in FIG. 6) from the two-way speaker units (right woofer $W_R$, right tweeter $T_R$, left woofer $W_L$ and left tweeter $T_L$) placed in a vehicle to a listener differ, an acoustic image (represented by broken lines in FIG. 6) is pulled to the position of the closest speaker unit owing to Haas effect (precedence effect), and hence a good sound field cannot be obtained.

In this case, time alignment processing (time adjustment) is carried out so that sounds emitted from the four speaker units arrive at the listener position simultaneously by providing the individual signals with delay processing. Band-splitting time compensation signal processing devices have been known which correct, by adjusting the arrival time of the sounds in this way, the sound field bias resulting from the distance differences between the individual speaker units and the listening position of the listener.

Conventionally, to adjust relative time relationships between the speaker units having a plurality of bands split, a band-splitting time compensation signal processing device has been known, for example. It has, as shown in FIG. 7, independent amplifiers (power amplifiers 71 and 72) for individual speaker units prepared for each channel (right channel speaker units $W_R$ and $T_R$, here), and has at their previous stage a band splitter 70 and delay circuits 73 and 74 for time axis adjustment. Here, only the R channel is shown, and for the L channel, the same circuit components are required additionally.

In this case, since the same number of amplifiers as the speaker units is necessary, problems arise of increasing the cost, complicating wiring and requiring a larger space.

On the other hand, there is a method that drives the speaker units, which have the bands split, with a single amplifier using a crossover network. In this case, a relative time difference between the band-split speaker units can be corrected by placing a digital signal processing circuit before the amplifier, by reproducing an impulse signal through the speakers, and by obtaining the inverse transfer function of the speaker system by observing the response waveforms followed by a convolution algorithm.

According to this method, however, the frequency characteristics and phase characteristics other than the time axis are corrected simultaneously, which means that it is impossible to adjust the time axis alone without changing the other characteristics. In addition, the values on the time axis cannot undergo fine adjustment independently.

In view of this, as for the method of driving the speaker units having a plurality of bands split with the single amplifier using the crossover network circuit, a listening position automatic compensation device is proposed that divides the band at about the same frequencies as the frequencies at which the crossover network circuit performs the band splitting before outputting to the amplifier, passes the individual signals after the division through delay circuits, and then mixes the signals again (see Patent Document 1, for example).

Patent Document 1: Japanese Patent Laid-Open No. 7-162985/1995

According to the technique disclosed in Patent Document 1, it corrects the bias in the sound field resulting from the distance differences between the individual speaker units and the listening position of the listener, and the disturbance of the frequency characteristics due to phase interference throughout the band.

However, it brings about a signal lost through the band-splitting circuit and a signal added double, which presents a problem of deteriorating the linearity of reproduced sounds, and produces a peak or dip in the frequency characteristics near the band-splitting frequency (crossover frequency) at the mixing.

The present invention is implemented to solve the foregoing problems. Therefore it is an object of the present invention to provide a band-splitting time compensation signal processing device capable of not only adjusting the time axis of each speaker unit independently, but also improving the linearity of the transfer characteristic at the listening position, and suppressing the occurrence of a peak or dip at the mixing point of time.

DISCLOSURE OF THE INVENTION

To solve the foregoing problems, a band-splitting time compensation signal processing device in accordance with the present invention includes, in an audio system for driving a plurality of speaker units, which have reproduction bands split, with a single amplifier for each channel via a crossover network circuit: at least one band-splitting circuit per channel for extracting, after extracting a signal of a high-frequency band component or low-frequency band component from an input signal, a signal of the low-frequency band component or high-frequency band component by subtracting the signal of the high-frequency band component or low-frequency band component from the input signal; a delay circuit for delaying, for adjusting arrival time, at least one of the two band component signals including the high-frequency band component and low-frequency band component output from at least one set of the band-splitting circuits; and a mixing circuit for combining the band-split signal including at least one of the high-frequency band component and low-frequency band component output from the delay circuit with the band-split signal including at least one of the low-frequency band component and high-frequency band component output from the band-splitting circuit, and for outputting to the amplifier.

According to the band-splitting time compensation signal processing device in accordance with the present invention, it goes without saying that it can adjust the time axes of the individual speaker units independently. In addition, it can improve the linearity of the transfer characteristics at the listening position and suppress the occurrence of a peak or dip at the mixing point.

BEST MODE FOR CARRYING OUT THE INVENTION

The best mode for carrying out the invention will now be described with reference to the accompanying drawings to explain the present invention in more detail.

Embodiment 1

Figure 1:
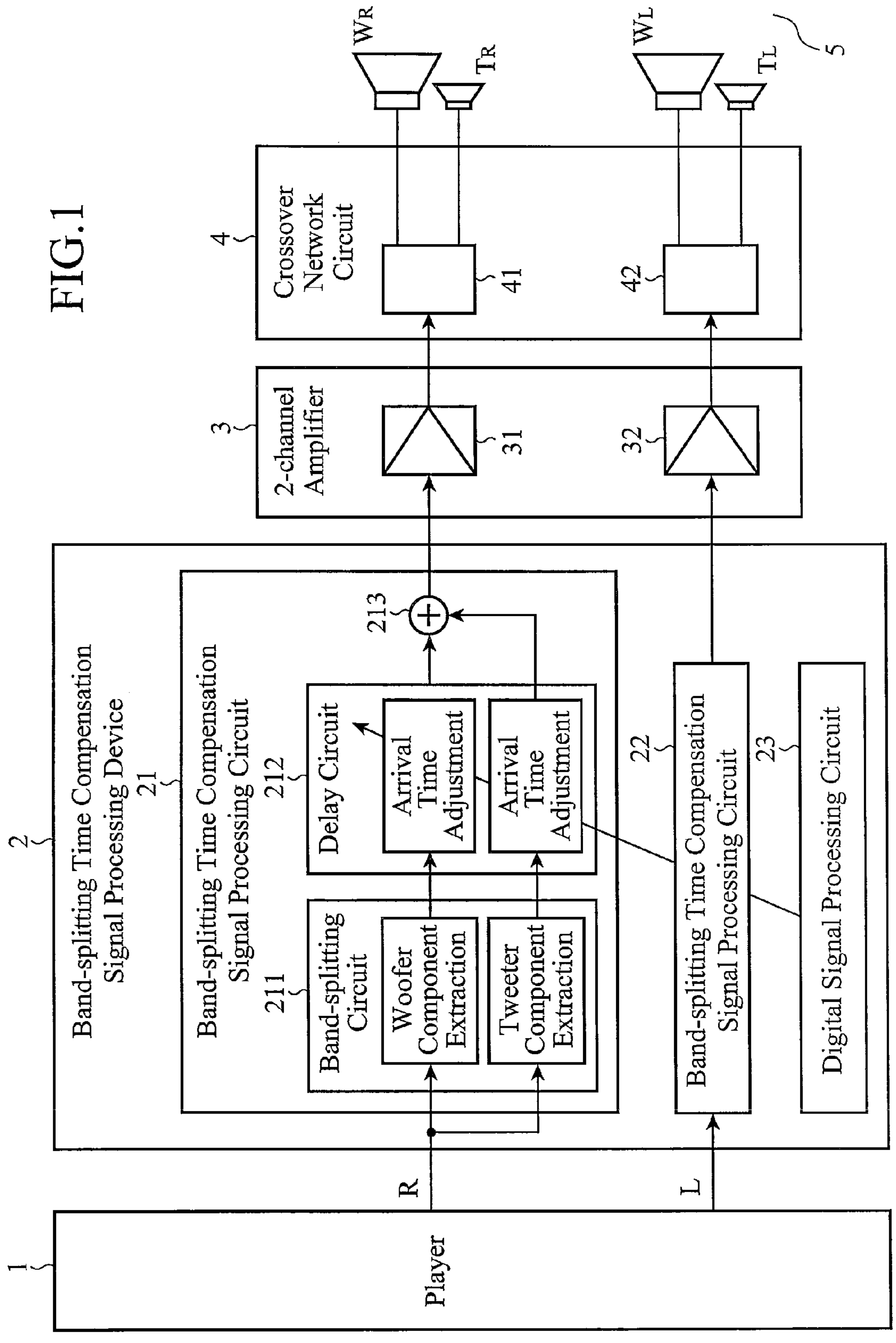
FIG. 1 is a block diagram showing an internal configuration of an audio system including a band-splitting time compensation signal processing device of an embodiment 1 in accordance with the present invention.

FIG. 1 is a block diagram showing an internal configuration of an audio system including a band-splitting time compensation signal processing device of an embodiment 1 in accordance with the present invention.

Here, an audio system with two channels of R and L is shown as an example. The audio system includes a player 1 serving as an input source, a band-splitting time compensation signal processing device 2, a two-channel amplifier 3, a crossover network circuit 4, and two-way speaker units 5 with woofers and tweeters.

The band-splitting time compensation signal processing device 2, which has a function of correcting the bias of the sound field resulting from the distance differences between the speaker units 5 and the listening position of a listener by adjusting the arrival time of sounds, includes an R-channel band-splitting time compensation signal processing circuit 21, an L-channel band-splitting time compensation signal processing circuit 22, and a digital signal processing circuit (DSP) 23.

The R-channel band-splitting time compensation signal processing circuit 21 comprises a band-splitting circuit 211, a delay circuit 212, and a mixing circuit 213.

The band-splitting circuit 211 extracts signals of a tweeter component (high-frequency band component) and a woofer component (low-frequency band component) from an R-channel input signal output from the player 1, and outputs to a delay circuit 212 at the next stage. The band-splitting circuit 211 extracts from the input signal the signal of the high-frequency band component or low-frequency band component, followed by extracting the signal of the low-frequency band component or high-frequency band component by subtracting the signal of the high-frequency band component or low-frequency band component extracted previously from the R-channel input signal.

Figure 2:
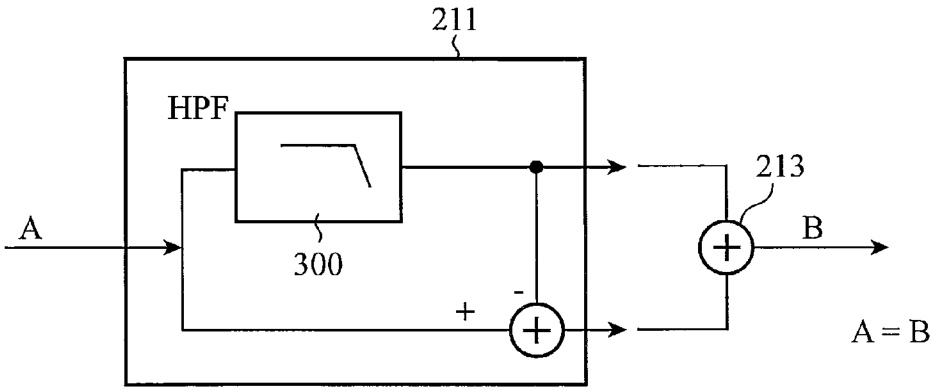
FIG. 2 is a diagram showing a circuit configuration of a band-splitting circuit of the band-splitting time compensation signal processing device of the embodiment 1 in accordance with the present invention.

Here, as its circuit configuration example is shown in FIG. 2, the band-splitting circuit 211 constituting the R-channel band-splitting time compensation signal processing circuit 21 uses a subtraction-type high-pass filter 300 (subtraction-type digital filter). It extracts the tweeter component signal from the R-channel input signal output from the player 1, followed by extracting the woofer component signal resulting from subtracting the tweeter component signal from the R-channel input signal, and by delivering them to the delay circuit 212 for the time axis adjustment and to the mixing circuit 213.

Incidentally, although the subtraction-type high-pass filter 300 is used as the band-splitting circuit 211, here, a subtraction-type low-pass filter can replace it. In this case, it extracts the woofer component signal from the R-channel input signal output from the player 1, and then extracts the tweeter component signal by subtracting the woofer component signal extracted previously from the R-channel input signal.

The delay circuit 212 delays at least one of the tweeter component and woofer component signals output from the band-splitting circuit 211 for adjusting the arrival time of the sounds, and outputs to the mixing circuit 213. Here, the woofer component signal is delayed for the time axis adjustment.

The mixing circuit 213 combines the woofer component signal output from the delay circuit 212 and the tweeter component signal output from the band-splitting circuit 211, and outputs to the two-channel amplifier 3.

Incidentally, as for the L-channel band-splitting time compensation signal processing circuit 22, since it has the same circuit configuration as the R-channel band-splitting time compensation signal processing circuit 21 described above except for acquiring the L-channel input signal output from the player 1, its description will be omitted here to avoid redundant explanation.

The DSP 23, when determining the delay of the delay circuit 212, observes impulse responses of the speaker units 5 composed of the woofers and tweeters whose reproduction bands are divided, obtains the inverse transfer functions of the speaker units 5, performs the convolution algorithm, and adjusts the transfer time of sounds resulting from the distance differences between the speaker units 5 and the listening position of the listener.

The two-channel amplifier 3, which consists of an R-channel power amplifier 31 and an L-channel power amplifier 32, amplifies the R-channel signal output from the mixing circuit 213 of the R-channel band-splitting time compensation signal processing circuit 21 and the L-channel signal output from a mixing circuit (not shown) of the L-channel band-splitting time compensation signal processing circuit 21, and outputs to the crossover network circuit 4.

The crossover network circuit 4, which is a band splitter on the speaker units 5 side and is composed of an R-channel network 41 and an L-channel network 42, band-splits the R-channel signal and L-channel signal output from the band-splitting time compensation signal processing circuits 21 and 22 via the two-channel amplifier 3 with a low-pass filter (LPF) and high-pass filter (HPF) with a cutoff frequency equivalent to the crossover frequency of the speaker units 5, and outputs to the speaker units 5 consisting of the woofer $W_R$ and tweeter $T_R$ and the woofer $W_L$ and tweeter $T_L$, respectively.

According to the foregoing embodiment 1, adjusting the splitting frequency of the band-splitting circuit 211 constituting the band-splitting time compensation signal processing circuit 21 to that of the crossover network circuit 4 enables independent characteristic correction for each of the speaker units 5 with the single two-channel amplifier 3 just as the case where amplifier circuits are provided for the individual speaker units 5. In addition, inserting the delay circuit 212 between the band-splitting circuit 211 and the mixing circuit 213 makes it possible to adjust and set the time axes of the individual speaker units 5 independently.

Furthermore, using the subtraction-type high-pass filter 300 (digital filter) for the band-splitting circuit 211 for band-splitting at nearly the same frequency as the frequency at which the crossover network circuit 4 carries out the band-splitting makes it possible to improve the linearity of the transfer characteristics at the listening position. In this connection, if the band-splitting circuit 211 is constructed from an HPF and an LPF as in the conventional device, it does not ensure the relationship of input(A)=output(B) from the viewpoint of the transfer function. In contrast with this, using the subtraction-type digital filter 300 can ensure the linearity of the transfer characteristics, which enables input(A)=output (B).

Embodiment 2

According to the band-splitting time compensation signal processing device 2 of the foregoing embodiment 1, although it can improve the linearity of the transfer characteristic at the listening position of the listener, it cannot always achieve flat frequency characteristics in the woofer component or tweeter component signal split by the difference, depending on the characteristics of the subtraction-type digital filter (subtraction-type high-pass filter 300) used for the band-splitting circuit 211 constituting the band-splitting time compensation signal processing circuit 21.

Figure 3:
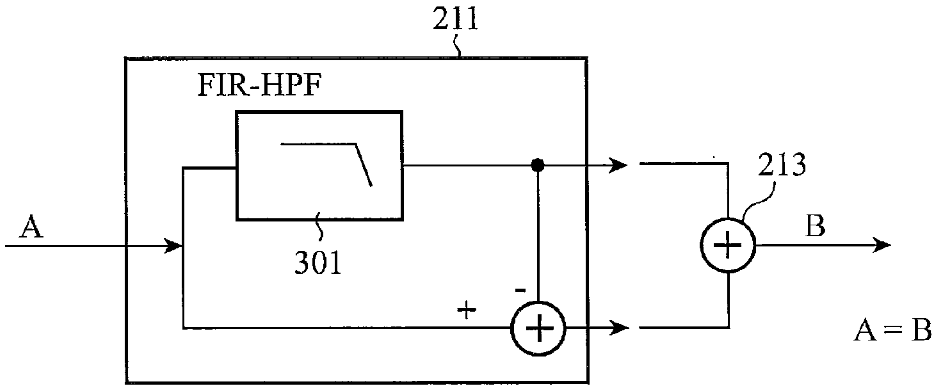
FIG. 3 is a diagram showing a circuit configuration of a band-splitting circuit of a band-splitting time compensation signal processing device of an embodiment 2 in accordance with the present invention.

For this reason, as an example of its circuit configuration is shown in FIG. 3, the embodiment 2 which will be described below employs an FIR linear phase high-pass filter 301 consisting of an FIR digital filter as the band-splitting circuit 211 constituting the band-splitting time compensation signal processing circuit 21. Incidentally, as for the audio system to which the embodiment 2 is applied, it is assumed to have the same configuration as the foregoing embodiment 1.

As is generally known, the FIR (Finite Impulse Response) filter is a filter, the duration of the impulse response of which is finite (the impulse response becomes zero within finite duration) and the term "linear phase" refers to that in which the phase has a constant linear phase characteristics at all the frequencies.

In this case, as for the R-channel input signal, the FIR linear phase high-pass filter 301 extracts a signal of only the tweeter component, and then extracts the woofer component signal by subtracting the tweeter component signal from the R-channel input signal, thereby splitting into the tweeter component and woofer component signals. After that, for the time axis adjustment, the delay circuit 212 performs the delay processing on the individual bands passing through the splitting or on one of them. Assume here that the delay time for the tweeter component signal is $T_T$ and the delay time for the woofer component signal is $T_w$, then $T_T - T_W$ represents the time the tweeter component signal delays relatively with respect to the woofer component signal.

According to the foregoing embodiment 2, using the FIR linear phase high-pass filter 301 consisting of the FIR digital filter as the band-splitting circuit 211 of the band-splitting time compensation signal processing circuit 21, it can ensure the high linearity close to the input signal and avoid the occurrence of a peak through the linear phase combining of the woofer component and the tweeter component by combining the signals of the high-frequency band component and low-frequency band component with the mixing circuit 213 after canceling out the differences between the time axes of the speaker units 5 with the delay circuit 212. In other words, it can not only improve the linearity of the transfer characteristic (A1=A2) at the listening position, but also ensure the flat frequency characteristics in the tweeter component or woofer component signal split by the difference.

Incidentally, although only the R-channel input signal is described here, as to the L-channel input signal, the same advantages can also be achieved by using an FIR digital filter with the linear phase characteristics as the band-splitting time compensation signal processing circuit 21 (band-splitting circuit). In addition, although the FIR linear phase high-pass filter 301 consisting of the FIR digital filter is used here, an FIR linear phase low-pass filter can replace it, in which case the signal split by the difference is the tweeter component.

Embodiment 3

According to the foregoing embodiment 2, although the FIR filter with the linear phase characteristics reflects its feature in the tweeter component signal extracted by the FIR linear phase high-pass filter 301, it does not reflect its feature in the woofer component signal split by subtracting the tweeter component signal.

Figure 4:
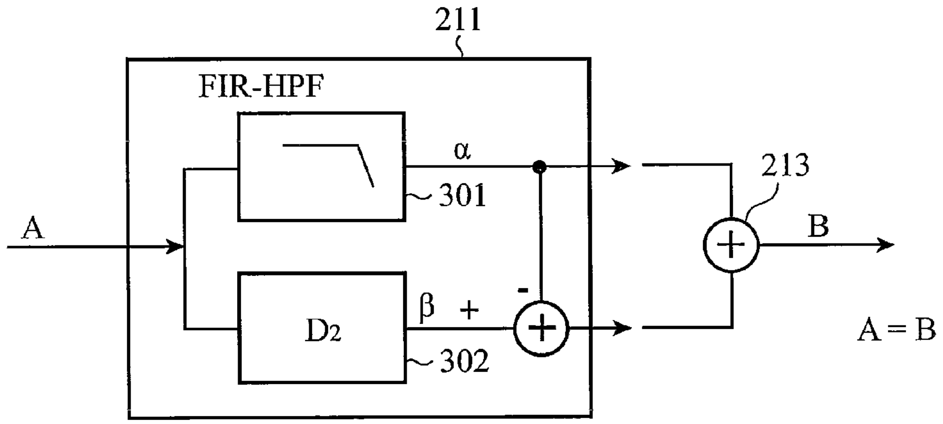
FIG. 4 is a diagram showing a circuit configuration of a band-splitting circuit of a band-splitting time compensation signal processing device of an embodiment 3 in accordance with the present invention.

For this reason, as an example of its circuit configuration is shown in FIG. 4, the embodiment 3 which will be described below inserts a delay circuit 302 (second delay circuit) having a delay D2 corresponding to the group delay time of the FIR linear phase high-pass filter 301 into a path β for extracting the woofer component signal split by subtracting the tweeter component signal from the R-channel input signal in the band-splitting time compensation signal processing circuit 21.

The same is true for the L-channel input signal. Here, the term "group delay" refers to a phenomenon that outputs a toneburst with a little delay, and the term "group delay time" refers to a frequency differential value of the phase shift. Incidentally, the audio system to which the embodiment 3 is applied is assumed to have the same configuration as the foregoing embodiment 1.

According to the foregoing embodiment 3, it goes without saying that the linearity of the transfer function is ensured (A1=A2). In addition, inserting the delay circuit 302 into the foregoing path β enables not only the tweeter component signal extracted by the FIR linear phase high-pass filter 301 but also the woofer component signal split by subtracting the tweeter component signal from the input signal to obtain the good frequency characteristics that ensure the flatness in the passband.

Embodiment 4

According to the foregoing embodiment 3, one of the woofer component signal and tweeter component signal output from the band-splitting circuit 211 further passes through the delay circuit 212 that performs the time axis adjustment, and the two signals are combined through the mixing circuit 213. In this case, the synthesized characteristic value at the crossover frequency has a peak of a maximum of 1.4 times depending on the delay of the delay circuit 212 for the time axis adjustment.

For this reason, a reduction in the dynamic range can occur in the digital filter constituting the band-splitting circuit 211. In this case, employing the FIR digital filter (FIR linear phase high-pass filter 301) with linear phase characteristics makes it possible to completely adjust the phases of the two signals because it can achieve the phase linearity, and to prevent the synthesized characteristic value at the crossover frequency from exceeding one, thereby being able to prevent the reduction in the dynamic range in the band-splitting circuit 211.

However, if the phase shift between the two signals occurs at the crossover frequency, a dip can take place.

Figure 5:
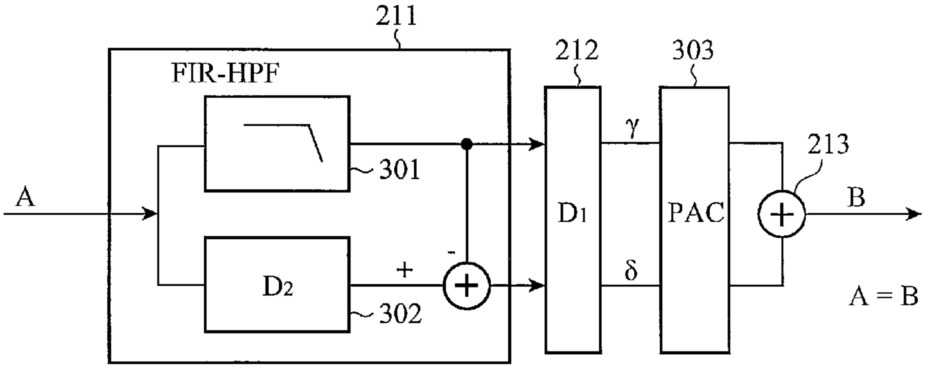
FIG. 5 is a diagram showing a circuit configuration of a band-splitting circuit of a band-splitting time compensation signal processing device of an embodiment 4 in accordance with the present invention.
Figure 6:
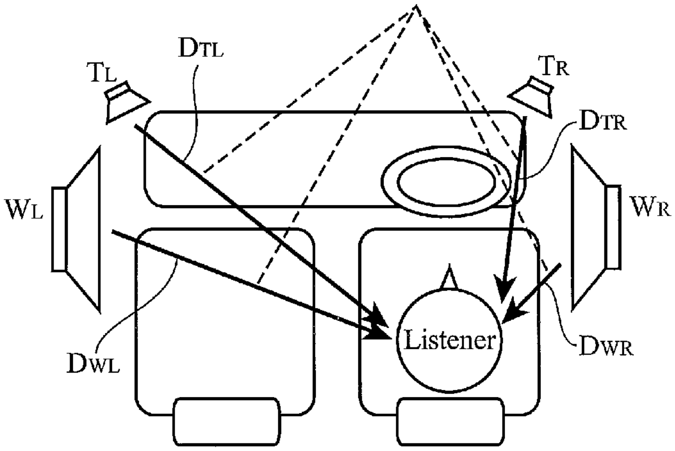
FIG. 6 is a diagram cited for explaining a sound field of an onboard audio system.
Figure 7:
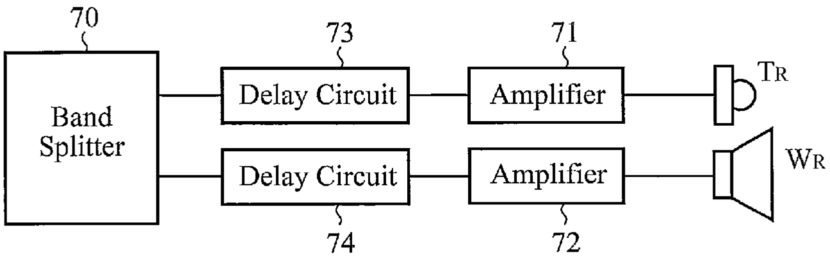
FIG. 7 is a diagram cited for explaining an audio system including a conventional band-splitting time compensation signal processing device.

For this reason, in the following embodiment 4, as an example of the circuit configuration of which is shown in FIG. 5, a phase adjusting circuit (PAC 303) for correcting the phase at the crossover frequency is inserted into at least one of the paths of the signal path γ of the tweeter component output by the band-splitting circuit 211 constituting the band-splitting time compensation signal processing circuit 21 and the signal path δ of the woofer component generated by the difference between the input signal and the tweeter component. Incidentally, the audio system to which the embodiment 4 is applied is assumed to have the same configuration as the foregoing embodiment 1.

In the foregoing configuration, the tweeter component and woofer component signals output from the band-splitting circuit 211 pass through the delay circuit 212 (with the delay D1) for the time axis adjustment, and then one of the tweeter component and woofer component signals or both of them pass through the phase adjusting circuit (PAC 303) for rotating only the phase while maintaining the flat frequency characteristics. Then, the mixing circuit 213 combines the tweeter component and woofer component signals passing through the phase adjusting circuit (PAC 303), and the two-channel amplifier 3 amplifies the input signals of both R and L channels and outputs to the crossover network circuit 4. The crossover network circuit 4 performs the band-splitting assigned to the individual speakers 5, and the individual speakers 5 are driven in response to the input signals to the individual channels which are band split.

According to the foregoing embodiment 4, the tweeter component and woofer component signals passing through the phase adjusting circuit (PAC 303) are combined by the mixing circuit 213. In this case, optimizing the amount of correction of the phase adjusting circuit 303 makes it possible to suppress the dip occurring at the crossover frequency. This enables time axis correction between the individual speaker units 5 while maintaining the high linearity.

As described above, the band-splitting time compensation signal processing devices 2 of the embodiments 1-4 in accordance with the present invention have a single amplifier circuit assigned to each channel (two-channel amplifier 3), and can set the time axes between the speaker units 5 freely when driving the speaker units 5 having a plurality of bands split with the crossover network circuit 4, and thus can provide high linearity and flat frequency characteristics. This makes it possible to provide a low cost, high performance audio system.

Incidentally, the DSP 23 measures a rise time of each of the speaker units 5 by searching for peak values exceeding a threshold from the impulse responses of the plurality of speaker units 5, performs a differential algorithm between the rise times of the earliest rise time speaker unit 5 and the other speaker units, and sets the delay at the reproduction of the individual speaker units 5 in accordance with the differential algorithms. The technique itself is a generally known technique as a time alignment method for adjusting sounds emitted from the individual speaker units in such a manner as to arrive at the listening position of the listener simultaneously by performing delay processing on the signals to be supplied to the individual speaker units 5. The foregoing function is sometimes implemented in cooperation with a CPU not shown.

Incidentally, although the foregoing embodiments 1-4 in accordance with the present invention are described by way of example of an onboard audio system, they are applicable not only to the onboard audio system, but also to audio systems for home use and to all the audio systems independently of fields, not to mention for theater use.

In addition, as for the functions of the individual configuration blocks of the band-splitting time compensation signal processing device 2 shown in FIG. 1, all of them can be implemented with software, or at least a part of them can be implemented with hardware. For example, as for the data processing of the DSP 23, which observes the impulse responses of the plurality of speaker units 5 having the reproduction bands split, performs the convolution algorithm by obtaining the inverse transfer functions of the individual speaker units 5, and determines the delay of the delay circuit 212 for adjusting the arrival time of sounds resulting from the distance differences between the individual speaker units 5 and the listening position of the listener, it can be implemented by a single or a plurality of programs on a computer, or at least part of it can be implemented with hardware.

Furthermore, although the foregoing embodiments in accordance with the present invention are described by taking examples which split into two bands of the low-frequency band component and high-frequency band component, three or more band-splitting can also be carried out by inserting, between the band-splitting circuit 211 and the mixing circuit 213, band-splitting circuits with a similar configuration with different splitting frequencies in a multi-stage mode.

INDUSTRIAL APPLICABILITY

As described above, since the band-splitting time compensation signal processing device in accordance with the present invention is configured in such a manner that it includes at least one band-splitting circuit per channel for extracting, after extracting a signal of a high-frequency band component or low-frequency band component from an input signal, a signal of the low-frequency band component or high-frequency band component by subtracting the signal of the high-frequency band component or low-frequency band component from the input signal; a delay circuit for delaying, for adjusting arrival time, at least one of the two band component signals including the high-frequency band component and low-frequency band component output from at least one set of the band-splitting circuits; and a mixing circuit for combining the band-split signal including at least one of the high-frequency band component and low-frequency band component output from the delay circuit with the band-split signal including at least one of the low-frequency band component and high-frequency band component output from the band-splitting circuit, and for outputting to the amplifier, it goes without saying that it can adjust the time axes of the individual speaker units independently. In addition, it can improve the linearity of the transfer characteristics at the listening position and suppress the occurrence of a peak or dip at the mixing point. Accordingly, it is suitable for the application to an onboard audio system and the like including the band-splitting time compensation signal processing device.

What is claimed is:

1. A band-splitting time compensation signal processing device in an audio system for driving a plurality of speaker units, which have reproduction bands split, with a single amplifier for each channel via a crossover network circuit, the band-splitting time compensation signal processing device comprising:

a band-splitting circuit per channel for extracting a signal of a high-frequency band component or low-frequency band component from an input signal, obtaining a signal of the low-frequency band component or high-frequency band component by subtracting the extracted signal of the high-frequency band component or low-frequency band component from the input signal, and outputting the extracted signal and the obtained signal so that the high-frequency band component and the low-frequency band component are outputted as respective band-split signals;

a delay circuit per channel for delaying, for adjusting arrival time, at least one of the two band-split signals output from the band-splitting circuit; and a mixing circuit per channel for combining the band-split signals after the at least one of the band-split signals is delayed by the delay circuit, and for outputting the combined signal to the amplifier, wherein the band-splitting time compensation signal processing device carries out independent characteristic correction for each of the speaker units by adjusting the splitting frequency of the band-splitting circuit with that of the crossover network circuit, and adjusts and sets the time axes of the individual speaker units independently via the delay circuit inserted between the band-splitting circuit and the mixing circuit.

2. The band-splitting time compensation signal processing device according to claim 1, wherein the band-splitting circuit is constructed from an FIR filter having linear phase characteristics.

3. The band-splitting time compensation signal processing device according to claim 2, wherein the band-splitting circuit constructed from the FIR filter comprises:

a second delay circuit which is inserted into a path for obtaining the signal of the low-frequency band component or high-frequency band component by subtracting from the input signal the extracted signal of the high-frequency band component or low-frequency band component, said second delay circuit having a delay corresponding to a group-delay time of the band-splitting circuit.

4. The band-splitting time compensation signal processing device according to claim 1, further comprising:

a phase adjusting circuit for adjusting phases of the high-frequency band component and low-frequency band component at a crossover frequency, the phase adjusting circuit being inserted into at least one of:

a path for transferring a band-split signal output by the delay circuit, and a path for transferring a band-split signal output by the band-splitting circuit.

5. The band-splitting time compensation signal processing device according to claim 1, further comprising:

a digital signal processing circuit for observing impulse responses of the plurality of speaker units which have reproduction bands split, for obtaining inverse transfer functions of the individual speaker units and performing a convolution algorithm, and for determining a delay of the delay circuit for adjusting the arrival time resulting from distance differences between the individual speaker units and a listening position.

6. The band-splitting time compensation signal processing device according to claim 1, which improves linearity of transfer characteristics at a listening position by making an output signal equal to the input signal in terms of transfer functions.

7. The band-splitting time compensation signal processing device according to claim 6, which employs a subtraction-type digital filter as the band-splitting circuit.

* * * * *